(12) United States Patent
Han et al.

(10) Patent No.: US 11,882,775 B2
(45) Date of Patent: Jan. 23, 2024

(54) ELECTRONIC DEVICE AND METHOD FOR FABRICATING THE SAME

(71) Applicant: SK hynix Inc., Icheon (KR)

(72) Inventors: Ji Sun Han, Icheon (KR); Yong Hun Sung, Icheon (KR); Byung Jick Cho, Icheon (KR)

(73) Assignee: SK hynix Inc., Icheon (KR)

( * ) Notice: Subject to any disclaimer, the term of this patent is extended or adjusted under 35 U.S.C. 154(b) by 315 days.

(21) Appl. No.: 17/467,084

(22) Filed: Sep. 3, 2021

(65) Prior Publication Data

US 2022/0328762 A1    Oct. 13, 2022

(30) Foreign Application Priority Data

Apr. 9, 2021   (KR) .......................... 10-2021-0046531

(51) Int. Cl.
*H10N 70/00*   (2023.01)
*H10B 63/00*   (2023.01)

(52) U.S. Cl.
CPC ........... *H10N 70/883* (2023.02); *H10B 63/80* (2023.02); *H10N 70/011* (2023.02); *H10N 70/841* (2023.02); *H10N 70/8845* (2023.02)

(58) Field of Classification Search
CPC .............................. H10N 63/00; H10N 70/00
See application file for complete search history.

(56) References Cited

FOREIGN PATENT DOCUMENTS

KR    1020140053325 A    5/2014

*Primary Examiner* — Marvin Payen

(57) ABSTRACT

An electronic device comprises a semiconductor memory that includes: a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer. The first electrode layer includes a first carbon material doped with a first element, and the first oxide layer includes a first oxide of the first element.

30 Claims, 10 Drawing Sheets

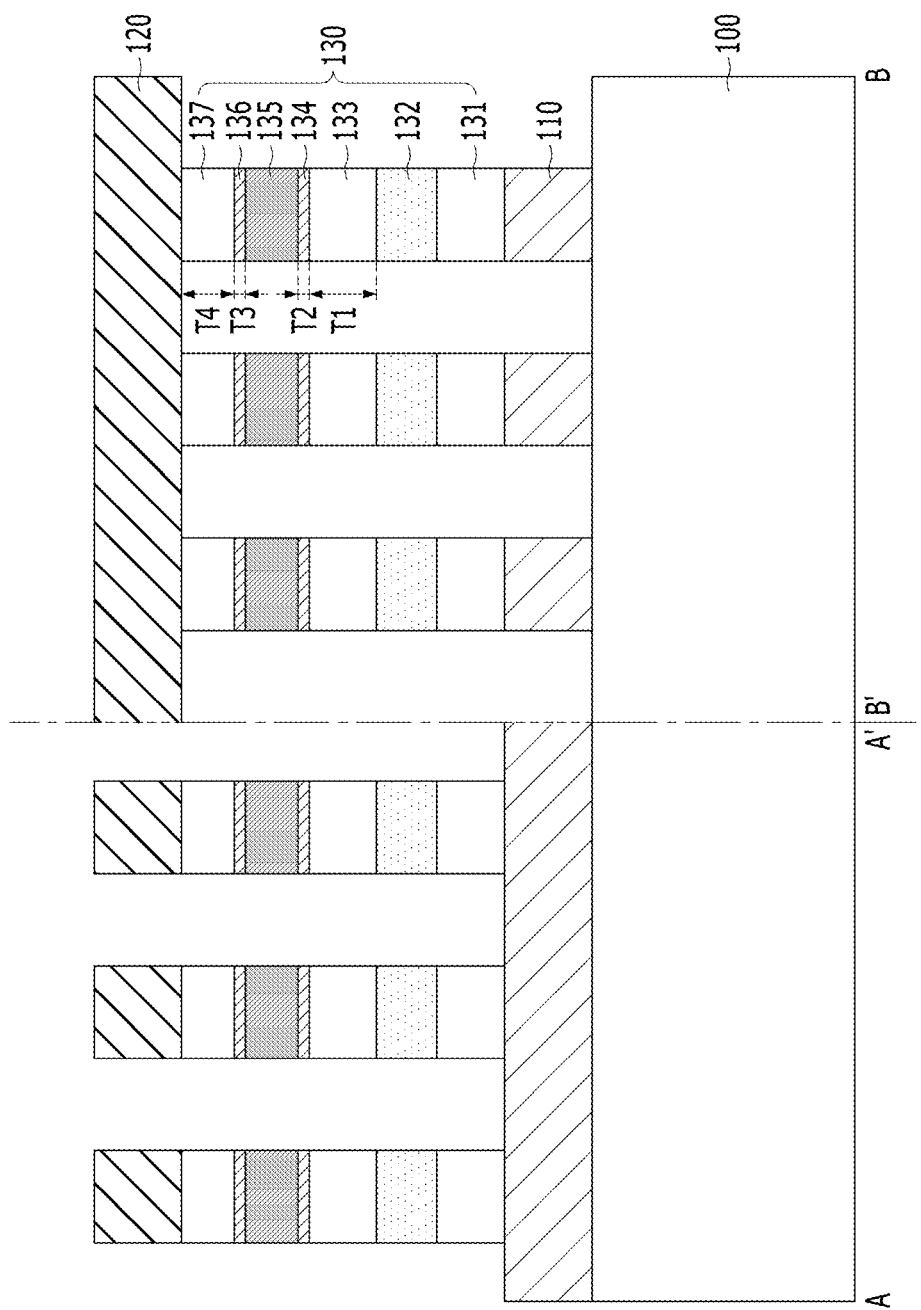

ELECTRONIC DEVICE AND METHOD FOR FABRICATING THE SAME

CROSS-REFERENCE TO RELATED APPLICATION

This application claims priority under 35 U.S.C. § 119 to Korean Patent Application No. 10-2021-0046531 filed on Apr. 9, 2021, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices can store data using a characteristic of switching between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of improving operating characteristics of a semiconductor memory and substantially preventing process defects, and a method for fabricating the same.

In an embodiment, an electronic device includes a semiconductor memory that includes: a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer, wherein the first electrode layer includes a first carbon material doped with a first element, and wherein the first oxide layer includes a first oxide of the first element.

In another embodiment, a method for fabricating an electronic device comprising a semiconductor memory includes: forming a first electrode layer and a first oxide layer over a substrate; and forming a variable resistance layer over the first oxide layer, wherein the forming of the first electrode layer and the first oxide layer comprises: forming an initial first electrode layer including a first carbon material doped with a first element; and forming the first oxide layer including a first oxide of the first element by treating a portion of the initial first electrode layer with a gas or plasma containing oxygen.

BRIEF DESCRIPTION OF THE DRAWINGS

FIGS. 1A and 1B are views illustrating a semiconductor memory according to an embodiment of the present disclosure.

DETAILED DESCRIPTION

Figure 1A:
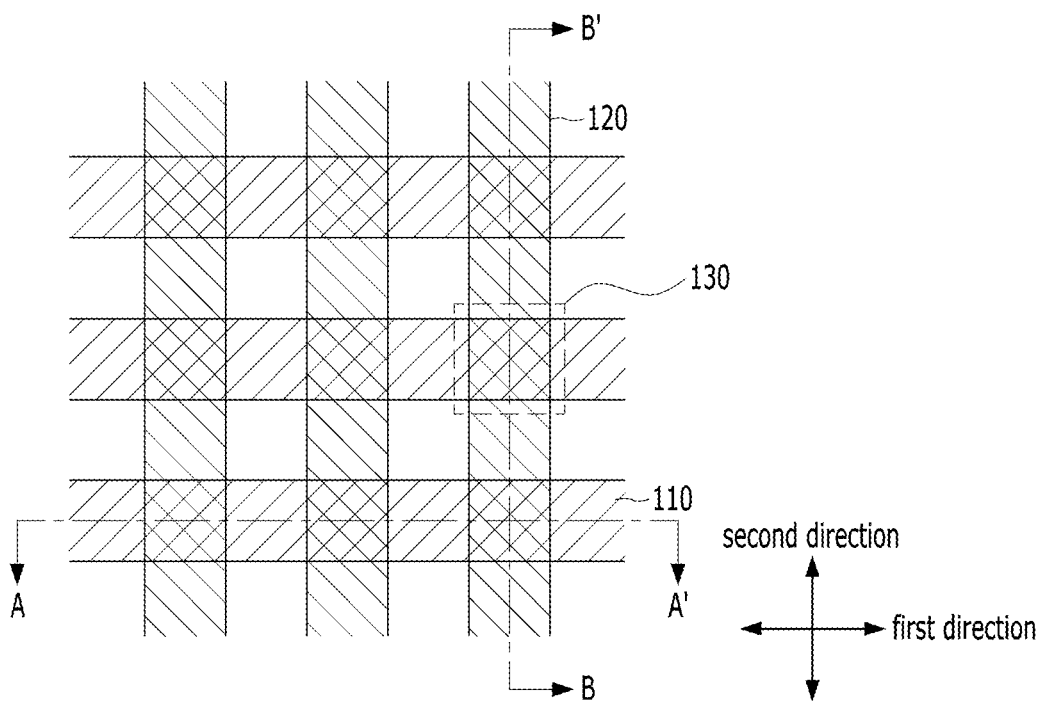

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A and 1B are views illustrating a semiconductor memory according to an embodiment of the present disclosure. FIG. 1A is a plan view, and FIG. 1B is a cross-sectional view taken along lines A-A' and B-B' of FIG. 1A.

Referring to FIGS. 1A and 1B, the semiconductor memory according to the present embodiment may include a substrate 100, first lines 110 formed over the substrate 100 and each extending in a first direction, second lines 120 formed over the first lines 110 to be spaced apart from the first lines 110 and each extending in a second direction crossing the first direction, and memory cells 130 disposed at intersections of the first lines 110 and the second lines 120 between the first lines 110 and the second lines 120.

The substrate 100 may include a semiconductor material such as silicon. A lower structure (not shown) may be formed in the substrate 100. For example, the substrate 100 may include a driving circuit (not shown) electrically connected to the first lines 110 and/or the second lines 120 to control them.

Each of the first line 110 and the second line 120 may include various conductive materials, for example, a metal such as platinum (Pt), tungsten (W), aluminum (Al), copper (Cu), and tantalum (Ta), a metal nitride such as titanium nitride (TiN) and tantalum nitride (TaN), or a combination thereof, and may have a single-layered structure or a multi-layered structure. The first line 110 and the second line 120 may be connected to a lower end and an upper end of the memory cell 130, respectively, and may transmit a voltage or current to the memory cell 130 to drive the memory cell 130. When the first line 110 functions as a word line, the second line 120 may function as a bit line. Conversely, when the first line 110 functions as a bit line, the second line 120 may function as a word line.

The memory cell 130 may include a variable resistance element that stores different data by switching between different resistance states according to a voltage or current applied to the first line 110 and the second line 120. As an example, in a plan view, the memory cell 130 may have a rectangular shape in which both sidewalls in the first direction are aligned with the second line 120, and both sidewalls in the second direction are aligned with the first line 110. However, embodiments of the present disclosure are not limited thereto, and as long as the memory cell 130 overlaps the intersection of the first line 110 and the second line 120, the planar shape of the memory cell 130 may be variously modified.

As an example, the memory cell 130 may include a stacked structure of a lower electrode layer 131, a selection element layer 132, an intermediate electrode layer 133, a variable resistance layer 135, and an upper electrode layer 137. Further, as an example, the memory cell 130 may include a first oxide layer 134 interposed between the variable resistance layer 135 and the intermediate electrode layer 133, and a second oxide layer 136 interposed between the variable resistance layer 135 and the upper electrode layer 137.

The lower electrode layer 131 may be interposed between the first line 110 and the selection element layer 132, and may function to electrically connect the first line 110 and the selection element layer 132 while physically separating them. The lower electrode layer 131 may include various conductive materials, for example, a metal such as platinum (Pt), tungsten (W), aluminum (Al), copper (Cu), and tantalum (Ta), a metal nitride such as titanium nitride (TiN) and tantalum nitride (TaN), or a combination thereof. Alternatively, the lower electrode layer 131 may include a carbon layer containing or without containing a dopant.

The selection element layer 132 may function to substantially prevent current leakage that may occur between the memory cells 130 sharing the first line 110 or the second line 120. To this end, the selection element layer 132 may have a threshold switching characteristic, that is, a characteristic for substantially blocking or limiting a current when a magnitude of an applied voltage is less than a predetermined threshold value and for allowing a current to abruptly increase when the magnitude of the applied voltage is greater than the threshold value. The selection element layer 132 may be implemented in a turn-on state or a turn-off state based on the threshold value. The selection element layer 132 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The intermediate electrode layer 133 may be interposed between the selection element layer 132 and the variable resistance layer 135, and may function to electrically connect the selection element layer 132 and the variable resistance layer 135 while physically separating them. In an embodiment, the intermediate electrode layer 133 may include a carbon material doped with a first element. Here, the carbon material doped with the first element may include a carbon element and the first element, but may be a material in which a main element is carbon and an additive element is the first element. As an example, a content of the first element in the intermediate electrode layer 133 may be in a range from 1 at % to 10 at %. The first element may be an element capable of being oxidized and/or easy to be oxidized, and an oxide of the first element may have a higher specific resistance than the carbon material doped with the first element. This may be for the formation of the first oxide layer 134 to be described later. As an example, the first element may include a metal element such as aluminum (Al), titanium (Ti), vanadium (V), tungsten (W), molybdenum (Mo), tantalum (Ta), and hafnium (Hf), or a semiconductor element such as silicon (Si) and boron (B). In addition, the carbon material doped with the first element may be amorphous.

The first oxide layer 134 may be interposed between the intermediate electrode layer 133 and the variable resistance layer 135. The first oxide layer 134 may include the oxide of the first element. For example, when the first element includes aluminum (Al), the first oxide layer 134 may include aluminum oxide ($Al_2O_3$). As will be described later, the first oxide layer 134 may be formed by oxidation of an initial electrode layer (e.g., an initial intermediate electrode layer 233 in FIG. 2), and thus, may be formed to directly contact the upper surface of the intermediate electrode layer 133 over the intermediate electrode layer 133. The first oxide layer 134 may have a greater resistance than the intermediate electrode layer 133, and accordingly, the first oxide layer 134 may have a function of reducing/suppressing emission of heat generated from the variable resistance layer 135. For example, when a reset current is applied to the memory cell 130 including the variable resistance layer 135 to reset the memory cell 130 into an amorphous phase, the first oxide layer 134 having a relatively high resistance may effectively block heat transfer from the variable resistance layer 135, and thus an amount of the reset current flowing through the memory cell 130 may be reduced compared to that used in a conventional memory cell. The first oxide layer 134 may be a conductive material having a greater resistance than the intermediate electrode layer 133, or may be an insulating material. When the first oxide layer 134 is an insulating material, the first oxide layer 134 may have a thin thickness through which a current can flow under an operating voltage of the memory cell 130. For example, the first oxide layer 134 may have a thickness of several to tens Å. A thickness T2 of the first oxide layer 134 may be smaller than a thickness T1 of the intermediate electrode layer 133.

When the carbon material doped with the first element is amorphous, it may be possible to form the first oxide layer 134 having a uniform thickness. That is, the thickness T2 of the first oxide layer 134 may have a substantially fixed (or constant) value. For example, a difference between a maximum value and a minimum value of the thickness T2 of the first oxide layer 134 is equal to or less than 5%, 3%, 1%, 0.5%, 0.3%, or 0.1% of an average of the thickness T2.

The variable resistance layer 135 may be a part that stores data in the memory cell 130. To this end, the variable resistance layer 135 may have a variable resistance characteristic of switching between different resistance states according to an applied voltage or current. The variable resistance layer 135 may have a single-layered structure or a multi-layered structure including at least one of materials used for an RRAM, a PRAM, an MRAM, an FRAM, or the like, that is, a metal oxide such as a perovskite-based oxide and a transition metal oxide, a phase change material such as a chalcogenide-based material, a ferromagnetic material, a ferroelectric material, or the like. In particular, as an example, the variable resistance layer 135 may include a phase change material that switches between an amorphous state and a crystalline state by Joule's heat generated according to a current flowing therethrough. When the phase change material is in an amorphous state, the phase change material may be in a relatively high resistance state, and when the phase change material is in a crystalline state, the phase change material may be in a relatively low resistance state. Data may be stored using the difference in resistance of the phase change material.

The upper electrode layer 137 may be interposed between the variable resistance layer 135 and the second line 120, and may function to electrically connect the variable resistance layer 135 and the second line 120 while physically separating them. The upper electrode layer 137 may include a carbon material doped with a second element. The second element may be an element capable of being oxidized and/or easy to be oxidized, and an oxide of the second element may have a higher specific resistance than the carbon material doped with the second element. A content of the second element in the upper electrode layer 137 may be in a range from 1 at % to 10 at %. As an example, the second element may include a metal element such as aluminum (Al), titanium (Ti), vanadium (V), tungsten (W), molybdenum (Mo), tantalum (Ta), and hafnium (Hf), or a semiconductor element such as silicon (Si) and boron (B). The second element may be the same as or different from the first element of the intermediate electrode layer 133 described above. In addition, the carbon material doped with the second element may be amorphous.

However, instead of the carbon material doped with the second element, other conductive materials, for example, a metal such as platinum (Pt), tungsten (W), aluminum (Al), copper (Cu), and tantalum (Ta), a metal nitride such as titanium nitride (TiN) and tantalum nitride (TaN), or a combination thereof, may be used as the upper electrode layer 137. This is because, as will be described later with reference to FIG. 3, the second oxide layer 136 may not be formed by oxidation of the upper electrode layer 137. Even in this case, the conductive material for forming the upper electrode layer 137 may be a material having a specific resistance sufficiently low to make a resistance of the upper electrode layer 137 lower than a resistance of the second oxide layer 136.

The second oxide layer 136 may be interposed between the variable resistance layer 135 and the upper electrode layer 137. The second oxide layer 136 may include the oxide of the second element. When the second element is the same as the first element, the second oxide layer 136 may be the same oxide as the first oxide layer 134. As will be described later, the second oxide layer 136 may be formed by oxidation of an initial carbon layer (e.g., an initial carbon layer 330 in FIG. 3) including a carbon material doped with the second element. The second oxide layer 136 may be formed to directly contact the lower surface of the upper electrode layer 137 under the upper electrode layer 137, and may have a greater resistance than the upper electrode layer 137. Accordingly, the second oxide layer 136 may have a function of reducing/suppressing the emission of the heat generated from the variable resistance layer 135. The second oxide layer 136 may be a conductive material having a greater resistance than the upper electrode layer 137, or may be an insulating material. When the second oxide layer 136 is an insulating material, the second oxide layer 136 may have a thin thickness through which a current can flow under the operating voltage of the memory cell 130. For example, the second oxide layer 136 may have a thickness of several to tens Å. A thickness T3 of the second oxide layer 136 may be smaller than a thickness T4 of the upper electrode layer 137. When the initial carbon layer (see 330 in FIG. 3) is amorphous, it may be possible to form the second oxide layer 136 having a uniform thickness. That is, the thickness T3 of the second oxide layer 136 may have a substantially fixed value.

In the memory cell 130 described above, the first oxide layer 134 and the second oxide layer 136 may be disposed below and above the variable resistance layer 135 so as to be adjacent to the variable resistance layer 135, and thus, it may be possible to reduce/suppress the heat generated from the variable resistance layer 135 from being radiated to the outside, for example, to the adjacent memory cell 130. If the first and second oxide layers 134 and 136 do not exist, the heat generated from the variable resistance layer 135 may be transferred to the adjacent memory cell 130, and thus, an issue of an increase in the operating voltage of the memory cell 130, in particular, an increase in a voltage during a reset operation in which the variable resistance layer 135 changes from a low resistance state to a high resistance state, an issue of changing characteristics of the adjacent memory cell 130, or the like, may occur. However, according to embodiments of the present disclosure, these issues may be addressed. Also, when heat is generated from Joule heating of the variable resistance layer 135 during a reset operation, the first and second oxide layers 134 and 136 may have relatively high thermal resistances and thus reduce a portion of the heat transferred from the variable resistance layer 135 to the electrode layers 133 and 137, respectively. Thus, another portion of the heat used for changing the variable resistance layer 135 from a low resistance state to a high resistance state may be increased. As a result, an amount of a reset current for the Joule heating of the variable resistance layer 135 in the memory cell 130 according to an embodiment of the present disclosure may be reduced compared to that in the conventional memory cell. Furthermore, by making the first and second oxide layers 134 and 136 each have a uniform thickness, the operating voltage of the memory cell 130 may be uniform.

The first oxide layer 134 and the second oxide layer 136 may directly contact the variable resistance layer 135. However, embodiments of the present disclosure are not limited thereto, and at least one of the first oxide layer 134 and the second oxide layer 136 may not directly contact the variable resistance layer 135. That is, another layer (not shown) may be interposed between and the variable resistance layer 135 and at least one of the first oxide layer 134 and the second oxide layer 136. These examples will be shown in FIGS. 3 and 4, and will be described in more detail in the corresponding part.

The first oxide layer 134 and the second oxide layer 136 may be symmetrical to each other with the variable resistance layer 135 interposed therebetween. That is, the first oxide layer 134 and the second oxide layer 136 may be formed of the same material, and the thickness T2 of the first oxide layer 134 and the thickness T3 of the second oxide layer 136 may be substantially identical to each other. However, embodiments of the present disclosure are not limited thereto, and the first oxide layer 134 and the second oxide layer 136 may be formed of different materials, and/or the thickness T2 of the first oxide layer 134 and the thickness T3 of the second oxide layer 136 may be different from each other. Furthermore, the intermediate electrode layer 133 and the upper electrode layer 137 may also be symmetrical to each other with the variable resistance layer 135 interposed therebetween. That is, the intermediate electrode layer 133 and the upper electrode layer 137 may be formed of the same material, and the thickness T1 of the intermediate electrode layer 133 and the thickness T4 of the upper electrode layer 137 may be substantially identical to each other. However, embodiments of the present disclosure are not limited thereto, and the intermediate electrode layer 133 and the upper electrode layer 137 may be formed of different materials, and/or the thickness T1 of the intermediate electrode layer 133 and the thickness T4 of the upper electrode layer 137 may be different from each other.

Meanwhile, the layered-structure of the memory cell 130 described above may be variously modified on the assumption that the variable resistance layer 135 which is essential for data storage and at least one of the first oxide layer 134 and the second oxide layer 136 which is essential for suppressing the heat emission are included in the memory cell 130.

As an example, either of the first oxide layer 134 and the second oxide layer 136 may be omitted. When the first oxide layer 134 is omitted, the intermediate electrode layer 133 may include the carbon material doped with the first element, or may include another conductive material. Alternatively, when the second oxide layer 136 is omitted, the upper electrode layer 137 may include the carbon material doped with the second element, or may include another conductive material.

Alternatively, as an example, at least one of the intermediate electrode layer 133 and the upper electrode layer 137 may be omitted.

Alternatively, as an example, at least one of the selection element layer 132 and the lower electrode layer 131 may be omitted.

Alternatively, as an example, the memory cell 130 may further include one or more layers for improving the characteristics of the memory cell 130, in addition to the layers 131 to 137 described above. This example will be shown in FIG. 4, and will be described in more detail in the corresponding part.

Alternatively, as an example, the positions of the selection element layer 132 and the variable resistance layer 135 may be reversed from each other. In this case, the relative positions/structures of the lower electrode layer 131, the intermediate electrode layer 133, the first and second oxide layers 134 and 136, and the upper electrode layer 137 may also be changed. This example will be shown in FIG. 5, and will be described in more detail in the corresponding part.

Spaces between the first lines 110, the second lines 120, and the memory cells 130 may be filled with an insulating material (not shown).

According to the semiconductor memory described above, it may be possible to improve operating characteristics of the memory cell 130 such as a decrease in the operating voltage, uniformity of the operating voltage, or the like.

Next, referring again to FIGS. 1A and 1B, an example of a method for fabricating the semiconductor memory according to the present embodiment will be described.

First, a conductive layer for forming the first lines 110 and material layers for forming the memory cells 130 may be formed over the substrate 100. Here, a process of forming the intermediate electrode layer 133 and the first oxide layer 134 will be described in more detail with reference to FIG. 2, and a process of forming the second oxide layer 136 and the upper electrode layer 137 will be described in more detail with reference to FIG. 3.

Figure 2:
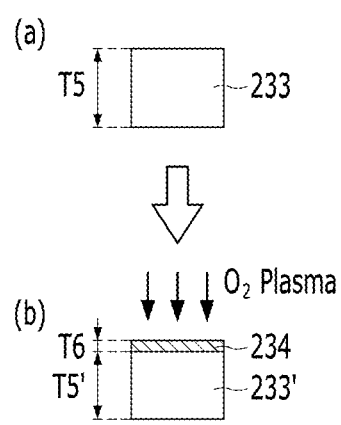
FIG. 2 is a view illustrating a process of forming an intermediate electrode layer and a first oxide layer of a semiconductor memory according to an embodiment of the present disclosure.

FIG. 2 is a view illustrating a process of forming an intermediate electrode layer and a first oxide layer of a semiconductor memory according to an embodiment of the present disclosure.

Referring to FIG. 2, in step (a), an initial intermediate electrode layer 233 may be formed over a substrate on which a conductive layer for forming the first line 110 of FIG. 1B and material layers for forming the lower electrode layer 131 and the selection element layer 132 of FIG. 1B are formed. The initial intermediate electrode layer 233 may include a carbon material doped with a first element, and may be formed by a deposition method such as physical vapor deposition (PVD). In particular, the initial intermediate electrode layer 233 may be formed by a sputtering method using a target containing carbon and the first element. In this case, the first element may be substantially uniformly doped in the initial intermediate electrode layer 233. That is, a concentration of the first element in a direction of a thickness T5 of the initial intermediate electrode layer 233 may be substantially constant. For example, a difference between a maximum concentration and a minimum concentration of the first element may be equal to or less than 5%, 3%, 1%, 0.5%, 0.3%, or 0.1% of an average concentration in the direction of the thickness T5 of the initial intermediate electrode layer 233. Also, the initial intermediate electrode layer 233 may be amorphous.

Subsequently, in step (b), the initial intermediate electrode layer 233 may be treated with a gas or plasma containing oxygen. For example, $O_2$ plasma treatment may be performed on the initial intermediate electrode layer 233. In this case, a portion of the intermediate electrode layer 233 may be oxidized to form an oxide layer 234. The oxide layer 234 may include an oxide of the first element doped in the initial intermediate electrode layer 233. Another portion of the initial intermediate electrode layer 233 that remains without being oxidized will be referred to as an intermediate electrode layer 233' hereinafter. Because the initial intermediate electrode layer 233 includes the uniformly doped first element and is in an amorphous state, the oxidation process may be uniformly performed, and thus, it may be possible to form the oxide layer 234 having a thickness T6 that is substantially uniform. The thickness T6 of the oxide layer 234 may be smaller than a thickness T5' of the intermediate electrode layer 233'.

The oxide layer 234 may correspond to the first oxide layer 134 of FIG. 1B described above, and the intermediate electrode layer 233' may correspond to the intermediate electrode layer 133 of FIG. 1B described above.

Figure 3:
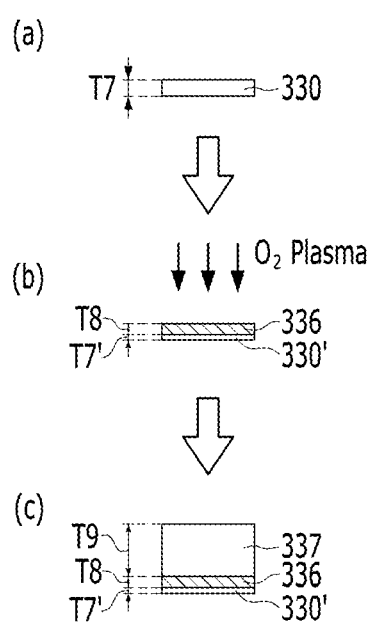
FIG. 3 is a view illustrating a process of forming a second oxide layer and an upper electrode layer of a semiconductor memory according to an embodiment of the present disclosure.

FIG. 3 is a view illustrating a process of forming a second oxide layer and an upper electrode layer of a semiconductor memory according to an embodiment of the present disclosure.

Referring to FIG. 3, in step (a), an initial carbon layer 330 may be formed over a substrate on which a conductive layer for forming the first line 110 of FIG. 1B, and material layers for forming the lower electrode layer 131, the selection element layer 132, the intermediate electrode layer 133, the first oxide layer 134, and the variable resistance layer 135 of FIG. 1B are formed. The initial carbon layer 330 may include a carbon material doped with a second element, and may be formed by a deposition method such as PVD. In this case, the second element may be substantially uniformly doped in the initial carbon layer 330. That is, a concentration of the second element in a direction of a thickness T7 of the initial carbon layer 330 may be substantially constant. In addition, the initial carbon layer 330 may be amorphous.

Subsequently, in step (b), the initial carbon layer 330 may be treated with a gas or plasma containing oxygen. For example, $O_2$ plasma treatment may be performed on the initial carbon layer 330. In this case, an oxide layer 336 may be formed by partially or entirely oxidizing the initial carbon layer 330. The oxide layer 336 may include an oxide of the second element doped in the initial carbon layer 330. Because the initial carbon layer 330 includes the uniformly doped second element and is in an amorphous state, the oxidation process may be uniformly performed to form the oxide layer 336 having a thickness T8 that is substantially uniform.

In the embodiment of FIG. 3, a case in which a portion of the initial carbon layer 330 is oxidized has been described. Another portion of the initial carbon layer 330 that remains without being oxidized will be referred to as a carbon layer 330' hereinafter. When the variable resistance layer 135 of FIG. 1B is present immediately below the initial carbon layer 330, the carbon layer 330' may prevent oxidation to the variable resistance layer 136. In this case, the carbon layer 330' may function to prevent direct contact between the oxide layer 336 and the variable resistance layer 136. A thickness T7' of the carbon layer 330' may be smaller than the thickness T8 of the oxide layer 336, and further, may have a relatively thin thickness of several Å. However, embodiments of the present disclosure are not limited thereto, and when precise process control is possible to the extent that oxidation of the variable resistance layer 136 can be substantially prevented, or another layer is interposed between the variable resistance layer 136 and the oxide layer 336, a whole of the initial carbon layer 330 may be oxidized. In this case, the carbon layer 330' may not be present.

Subsequently, in step (c), an upper electrode layer 337 may be formed over the oxide layer 336. The upper electrode layer 337 may include a carbon material doped with the second element or another conductive material.

The oxide layer 336 may correspond to the second oxide layer 136 of FIG. 1B described above, and the upper electrode layer 337 may correspond to the upper electrode layer 137 of FIG. 1B.

Referring back to FIGS. 1A and 1B, the conductive layer for forming the first lines 110 and the material layers for forming the memory cells 130 may be etched using a line-shaped mask pattern extending in the first direction, and accordingly, a stacked structure including the first line 110 and material layer patterns having a shape overlapping the first line 110 over the first line 110 may be formed. A space between the stacked structures each including the first line 110 and the material layer patterns may be filled with an insulating material.

Subsequently, a conductive layer for forming the second lines 120 may be formed over the stacked structures each including the first line 110 and the material layer patterns and the insulating material therebetween.

Subsequently, the conductive layer for forming the second lines 120 and material layer patterns may be etched using a line-shaped mask pattern extending in the second direction, thereby forming the second lines 120 and the memory cells 130.

Figure 4:
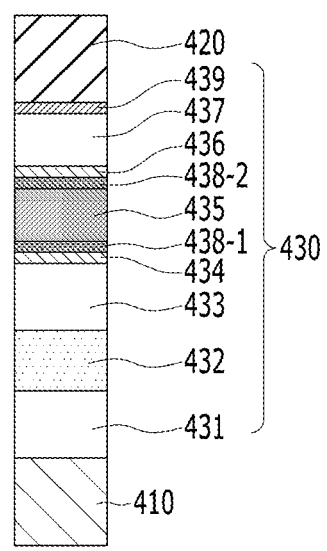
FIG. 4 is a view illustrating a semiconductor memory according to another embodiment of the present disclosure.

FIG. 4 is a view illustrating a semiconductor memory according to another embodiment of the present disclosure. For convenience, only a single memory cell and portions of upper and lower lines thereof are illustrated, but as described above with reference to FIGS. 1A and 1B, a plurality of memory cells may be arranged between lower lines and upper lines crossing the lower lines. It will be described focusing on differences from the above-described embodiment.

Referring to FIG. 4, a memory cell 430 may be disposed between a first line 410 and a second line 420.

As an example, the memory cell 430 may include a stacked structure of a lower electrode layer 431, a selection element layer 432, an intermediate electrode layer 433, a first oxide layer 434, a variable resistance layer 435, a second oxide layer 436, and an upper electrode layer 437. Further, as an example, the memory cell 430 may include a first interface electrode layer 438-1 between the variable resistance layer 435 and the first oxide layer 434, and a second interface electrode layer 438-2 between the variable resistance layer 435 and the second oxide layer 436. Further, as an example, the memory cell 430 may include a resistance layer 439 between the upper electrode layer 437 and the second line 420.

The first interface electrode layer 438-1 may be interposed between the variable resistance layer 435 and the first oxide layer 434, or between the variable resistance layer 435 and the intermediate electrode layer 433 when the first oxide layer 434 is omitted, and may serve to increase adhesion while reducing contact resistance between them. In particular, the first interface electrode layer 438-1 may serve to lower a set voltage applied during a set operation in which the variable resistance layer 435 changes from a high resistance state to a low resistance state. The first interface electrode layer 438-1 may contain a conductive material having low resistance and a good adhesion property, for example, a metal such as tungsten (W), lithium (Li), aluminum (Al), tin (Sn), bismuth (Bi), antimony (Sb), nickel (Ni), copper (Cu), titanium (Ti), vanadium (V), chromium (Cr), manganese (Mn), iron (Fe), cobalt (Co), zinc (Zn), and molybdenum (Mo).

The second interface electrode layer 438-2 may be interposed between the variable resistance layer 435 and the second oxide layer 436, or between the variable resistance layer 435 and the upper electrode layer 437 when the second oxide layer 436 is omitted, and may serve to increase adhesion while reducing contact resistance between them. In particular, the second interface electrode layer 438-2 may serve to lower a set voltage applied during a set operation in which the variable resistance layer 435 changes from a high resistance state to a low resistance state. The second interface electrode layer 438-2 may contain a conductive material having low resistance and a good adhesion property, for example, a metal such as tungsten (W), lithium (Li), aluminum (Al), tin (Sn), bismuth (Bi), antimony (Sb), nickel (Ni), copper (Cu), titanium (Ti), vanadium (V), chromium (Cr), manganese (Mn), iron (Fe), cobalt (Co), zinc (Zn), and molybdenum (Mo).

When a relatively large amount of current is supplied to drive the memory cell 430, an overshooting current or a spike current may flow through the memory cell 430 to cause an operation fail of the memory cell 430. The resistance layer 439 may be a layer for preventing this operation fail of the memory cell 430 from occurring. The resistance layer 439 may include a conductive material having a greater resistance than the lower electrode layer 431, the intermediate electrode layer 433, and the upper electrode layer 437. For example, the resistance layer 439 may include tungsten silicon nitride (WSiN). However, embodiments of the present disclosure are not limited thereto, and the resistance layer 439 may include an insulating material having a thin thickness of several to tens Å to allow a current to flow between the upper electrode layer 437 and the second line 420 at an operating voltage of the memory cell 430.

Figure 5:
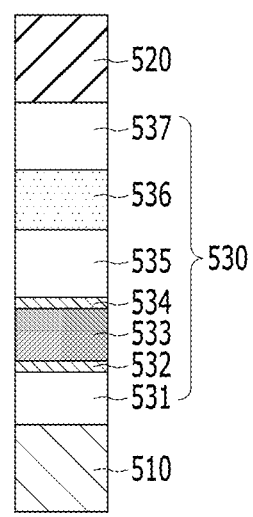
FIG. 5 is a view illustrating a semiconductor memory according to another embodiment of the present disclosure.

FIG. 5 is a view illustrating a semiconductor memory according to another embodiment of the present disclosure. It will be described focusing on differences from the above-described embodiments.

Referring to FIG. 5, a memory cell 530 may be disposed between a first line 510 and a second line 520.

As an example, the memory cell 530 may include a stacked structure of a lower electrode layer 531, a first oxide layer 532, a variable resistance layer 533, a second oxide layer 534, an intermediate electrode layer 535, a selection element layer 536, and an upper electrode layer 537.

In the embodiment of FIG. 5, unlike the above-described embodiments, the variable resistance layer 533 may be positioned under the selection element layer 536. For this reason, the first oxide layer 532 may be formed to be interposed between the lower electrode layer 531 and the variable resistance layer 533, and the second oxide layer 534 may be formed to be interposed between the intermediate electrode layer 535 and the variable resistance layer 533.

A stacked structure of the lower electrode layer 531 and the first oxide layer 532 may substantially correspond to the intermediate electrode layer 133 and the first oxide layer 134 of FIG. 1B described above. A stacked structure of the second oxide layer 534 and the intermediate electrode layer 535 may substantially correspond to the second oxide layer 136 and the upper electrode layer 137 of FIG. 1B described above. Therefore, a detailed description thereof will be omitted.

Figure 6:
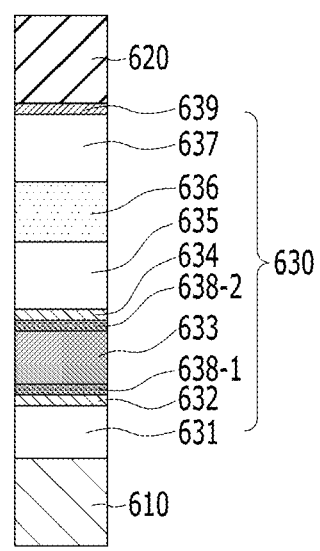
FIG. 6 is a view illustrating a semiconductor memory according to another embodiment of the present disclosure.

FIG. 6 is a view illustrating a semiconductor memory according to another embodiment of the present disclosure. It will be described focusing on differences from the above-described embodiments.

Referring to FIG. 6, a memory cell 630 may be disposed between a first line 610 and a second line 620.

As an example, the memory cell 630 may include a stacked structure of a lower electrode layer 631, a first oxide layer 632, a variable resistance layer 633, a second oxide layer 634, an intermediate electrode layer 635, a selection element layer 636, and an upper electrode layer 637. Further, as an example, the memory cell 630 may include a first interface electrode layer 638-1 between the variable resistance layer 633 and the first oxide layer 632, and a second interface electrode layer 638-2 between the variable resistance layer 633 and the second oxide layer 634. Further, as an example, the memory cell 630 may include a resistance layer 639 between the upper electrode layer 637 and the second line 620.

The first interface electrode layer 638-1, the second interface electrode layer 638-2, and the resistance layer 639 may substantially correspond to the first interface electrode layer 438-1, the second interface electrode layer 438-2, and the resistance layer 439 of FIG. 4, respectively. Therefore, a detailed description thereof will be omitted.

The above and other memory circuits or semiconductor devices based on the disclosed technology can be used in a range of devices or systems. FIGS. 7-10 provide some examples of devices or systems that can implement the memory circuits disclosed herein.

Figure 7:
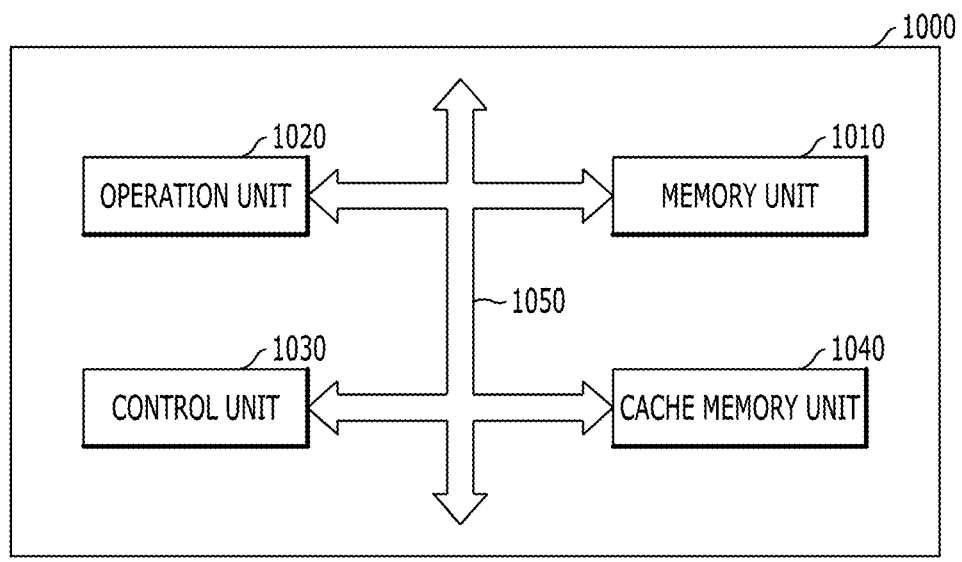
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer, wherein the first electrode layer includes a first carbon material doped with a first element, and wherein the first oxide layer includes a first oxide of the first element. Through this, in the memory unit 101, memory cell characteristics and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
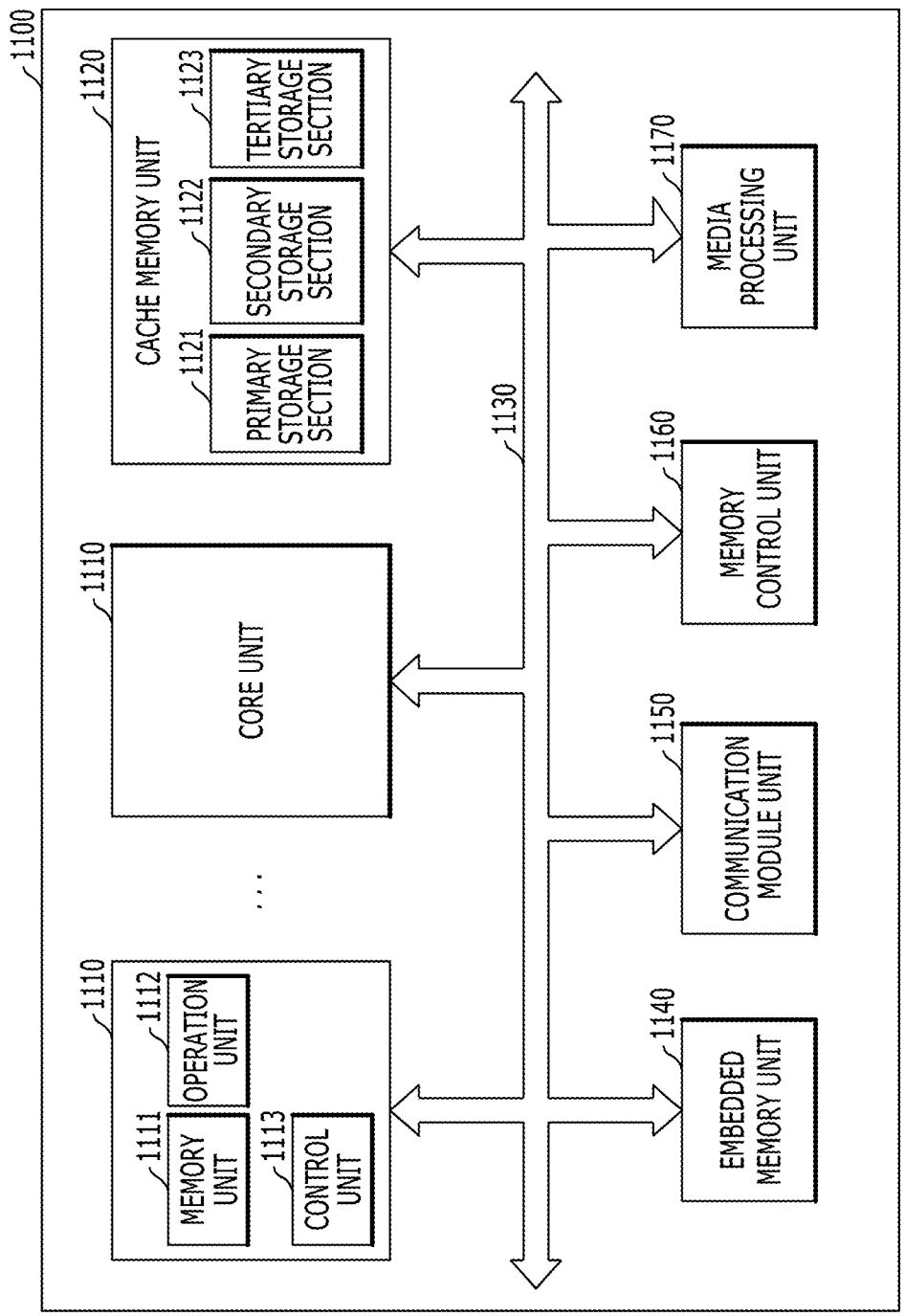
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer, wherein the first electrode layer includes a first carbon material doped with a first element, and wherein the first oxide layer includes a first oxide of the first element. Through this, memory cell characteristics and fabricating processes may be improved in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
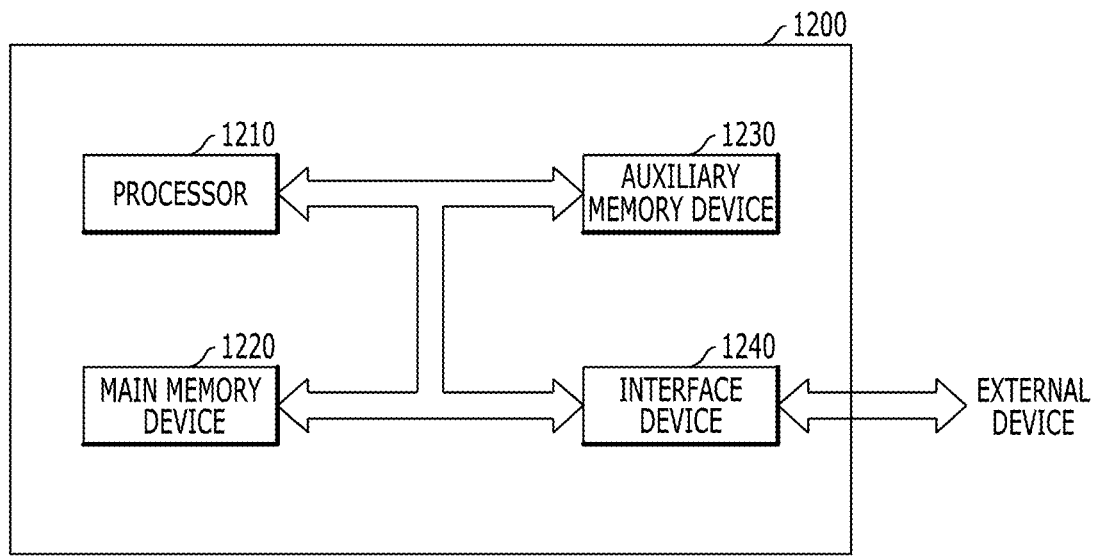
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer, wherein the first electrode layer includes a first carbon material doped with a first element, and wherein the first oxide layer includes a first oxide of the first element. Through this, memory cell characteristics and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 10) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 10:
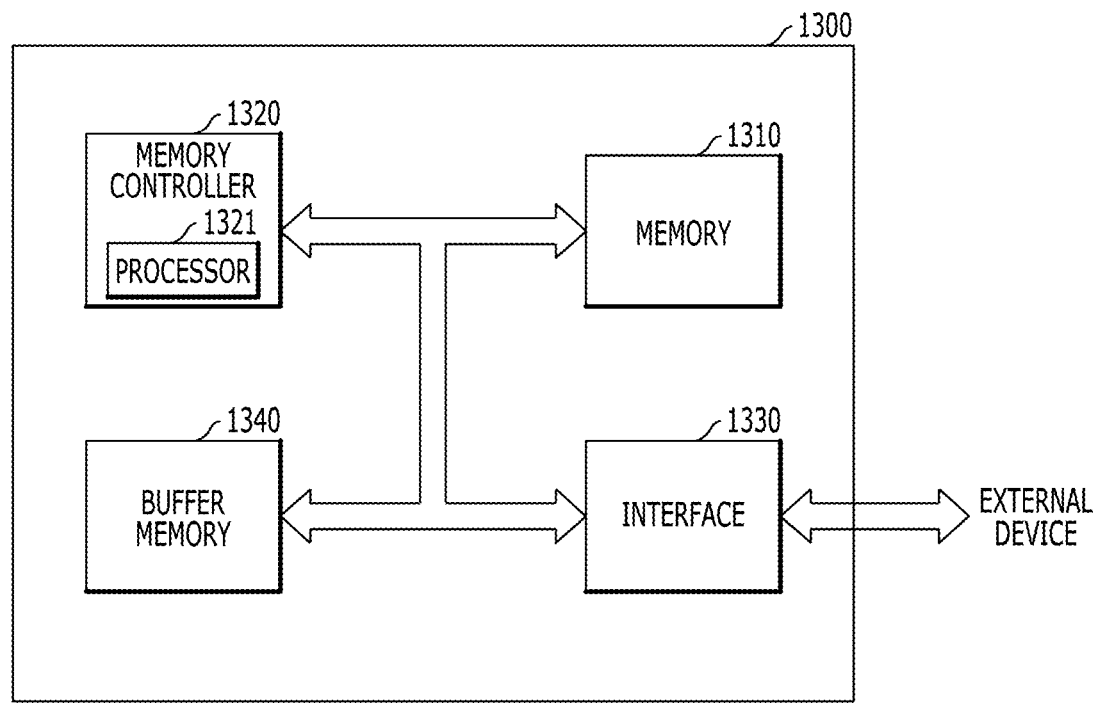
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a first line; a second line disposed over the first line to be spaced apart from the first line; a variable resistance layer disposed between the first line and the second line; a first electrode layer disposed between the first line and the variable resistance layer; and a first oxide layer disposed between the variable resistance layer and the first electrode layer, wherein the first electrode layer includes a first carbon material doped with a first element, and wherein the first oxide layer includes a first oxide of the first element. Through this, in the memory 1310 or the buffer memory 1340, memory cell characteristics and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 7-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

Although various embodiments have been described for illustrative purposes, it will be apparent to those skilled in the art that various changes and modifications may be made without departing from the spirit and scope of the present teachings as defined in the following claims.

What is claimed is:

1. An electronic device comprising a semiconductor memory, the semiconductor memory comprising:
    a first line;
    a second line disposed over the first line to be spaced apart from the first line;
    a variable resistance layer disposed between the first line and the second line;
    a first electrode layer disposed between the first line and the variable resistance layer; and
    a first oxide layer disposed between the variable resistance layer and the first electrode layer,
    wherein the first electrode layer includes a first carbon material doped with a first element, and
    wherein the first oxide layer includes a first oxide of the first element.

2. The electronic device according to claim 1, wherein a thickness of the first oxide layer is smaller than a thickness of the first electrode layer.

3. The electronic device according to claim 1, wherein a resistance of the first oxide layer is greater than a resistance of the first electrode layer.

4. The electronic device according to claim 1, wherein the first carbon material doped with the first element is amorphous.

5. The electronic device according to claim 1, wherein the first electrode layer and the first oxide layer are in direct contact with each other.

6. The electronic device according to claim 1, wherein the semiconductor memory further comprises:
    a second electrode layer disposed between the second line and the variable resistance layer; and
    a second oxide layer disposed between the second electrode layer and the variable resistance layer,
    wherein the second oxide layer includes a second oxide of a second element.

7. The electronic device according to claim 6, wherein the second electrode layer includes a second carbon material doped with the second element.

8. The electronic device according to claim 6, wherein the semiconductor memory further comprises:
    a carbon layer interposed between the second oxide layer and the variable resistance layer, and including a second carbon material doped with the second element.

9. The electronic device according to claim 6, wherein a thickness of the second oxide layer is smaller than a thickness of the second electrode layer.

10. The electronic device according to claim 8, wherein a thickness of the carbon layer is smaller than a thickness of the second oxide layer.

11. The electronic device according to claim 6, wherein a resistance of the second oxide layer is greater than a resistance of the second electrode layer.

12. The electronic device according to claim 8, wherein the second carbon material doped with the second element is amorphous.

13. The electronic device according to claim 1, wherein the semiconductor memory further comprises:
    a first interface electrode layer interposed between the first oxide layer and the variable resistance layer.

14. The electronic device according to claim 6, wherein the semiconductor memory further comprises:
    a second interface electrode layer interposed between the second oxide layer and the variable resistance layer.

15. The electronic device according to claim 1, wherein the semiconductor memory further comprises:
    a third electrode layer interposed between the second line and the variable resistance layer; and
    a resistance layer interposed between the second line and the third electrode layer.

16. The electronic device according to claim 1, wherein the semiconductor memory further comprises:
    a selection element layer interposed between the first electrode layer and the first line or between the variable resistance layer and the second line.

17. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

18. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

19. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

20. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

21. A method for fabricating an electronic device comprising a semiconductor memory, the method comprising:
forming a first electrode layer and a first oxide layer over a substrate; and forming a variable resistance layer over the first oxide layer,
wherein the forming of the first electrode layer and the first oxide layer comprises:
forming an initial first electrode layer including a first carbon material doped with a first element; and
forming the first oxide layer including a first oxide of the first element by treating a portion of the initial first electrode layer with a gas or plasma containing oxygen.

22. The method according to claim 21, wherein the forming of the initial first electrode layer is performed such that the first carbon material doped with the first element has an amorphous state.

23. The method according to claim 21, wherein the forming of the initial first electrode layer is performed such that a concentration of the first element is substantially constant in a thickness direction of the initial first electrode layer.

24. The method according to claim 21, wherein a remaining portion of the initial first electrode layer, except for the first oxide layer, forms the first electrode layer, and
wherein the forming of the first oxide layer is performed such that the first oxide layer has a thickness smaller than a thickness of the first electrode layer.

25. The method according to claim 21, further comprising:
forming a second oxide layer over the variable resistance layer.

26. The method according to claim 25, wherein the forming of the second oxide layer comprises:
forming an initial carbon layer comprising a second carbon material doped with a second element; and
forming the second oxide layer including a second oxide of the second element by treating at least a portion of the initial carbon layer with a gas or plasma containing oxygen.

27. The method according to claim 26, wherein the forming of the initial carbon layer is performed such that the second carbon material doped with the second element has an amorphous state.

28. The method according to claim 26, wherein the forming of the initial carbon layer is performed such that a concentration of the second element is substantially constant in a thickness direction of the initial carbon layer.

29. The method according to claim 26, wherein, when the portion of the initial carbon layer is oxidized, a remaining portion of the initial carbon layer, except for the second oxide layer, forms a carbon layer, and
wherein the forming of the second oxide layer is performed such that the second oxide layer has a thickness greater than a thickness of the carbon layer.

30. The method according to claim 25, further comprising:
forming a second electrode layer over the second oxide layer.

* * * * *